United States Patent [19]

Wada et al.

[11] Patent Number: 4,647,782
[45] Date of Patent: Mar. 3, 1987

[54] CHARGED PARTICLE BEAM EXPOSURE APPARATUS

[75] Inventors: Hirotsugu Wada, Tokyo; Shunichi Sano, Zama; Mamoru Nakasuji; Ryoichi Yoshikawa, both of Yokohama, all of Japan

[73] Assignee: Tokyo Shibaura Denki Kabushiki Kaisha, Kawasaki, Japan

[21] Appl. No.: 800,918

[22] Filed: Nov. 25, 1985

Related U.S. Application Data

[63] Continuation of Ser. No. 535,260, Sep. 23, 1983, abandoned.

[30] Foreign Application Priority Data

Sep. 30, 1982 [JP] Japan ................. 57-171377

[51] Int. Cl.⁴ ............................................. H01J 37/30
[52] U.S. Cl. ............................. 250/492.2; 250/398
[58] Field of Search ........... 250/492.2, 492.22, 492.23, 250/492.3, 396 R, 398

[56] References Cited

U.S. PATENT DOCUMENTS

| | | | |
|---|---|---|---|
| 4,151,422 | 4/1979 | Goto et al. | 250/396 R |
| 4,258,265 | 3/1981 | Sumi | 250/492.2 |
| 4,393,310 | 7/1983 | Hahn | 250/492.2 |

FOREIGN PATENT DOCUMENTS

| | | |
|---|---|---|
| 0030347 | 6/1981 | European Pat. Off. . |
| 0083246 | 7/1983 | European Pat. Off. ......... 250/492.2 |
| 54-128680 | 12/1979 | Japan . |
| 2116358 | 9/1983 | United Kingdom ........... 250/396 R |

OTHER PUBLICATIONS

Solid State Technology, vol. 25, No. 6, Jun. 1982, pp. 74–82, Port Washington, N.Y., US; B. P. Piwczyk, et al.: "Electron Beam Lithography for the 80s"* Figures 6,7, p. 77, right-hand raster/vector scan systems".

*Primary Examiner*—Bruce C. Anderson
*Assistant Examiner*—Paul A. Guss
*Attorney, Agent, or Firm*—Oblon, Fisher, Spivak, McClelland & Maier

[57] ABSTRACT

The dimensions of the cross section of an electron beam emitted from a beam source are changed by deflectors interposed between a pair of aperture masks and are position-corrected by beam position correction deflectors. The electron beam is then irradiated onto a wafer. In accordance with beam dimension signals from a CPU, a correction signal generating circuit supplies correction signals to a beam position correction circuit. The circuit supplies beam position correction signals to the deflectors.

8 Claims, 14 Drawing Figures

F I G. 2
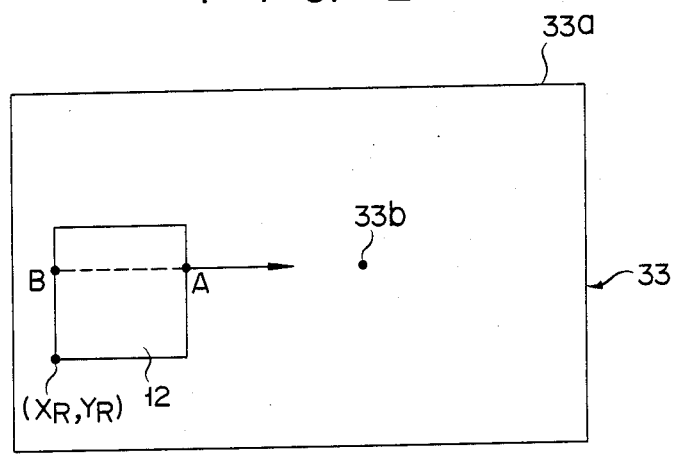
F I G. 3
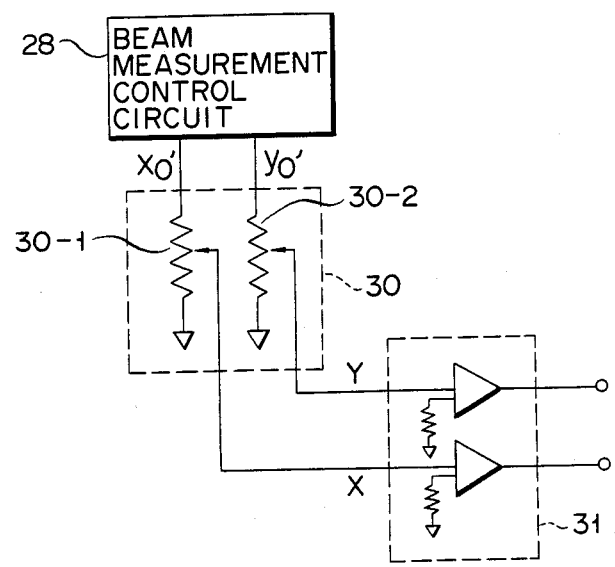

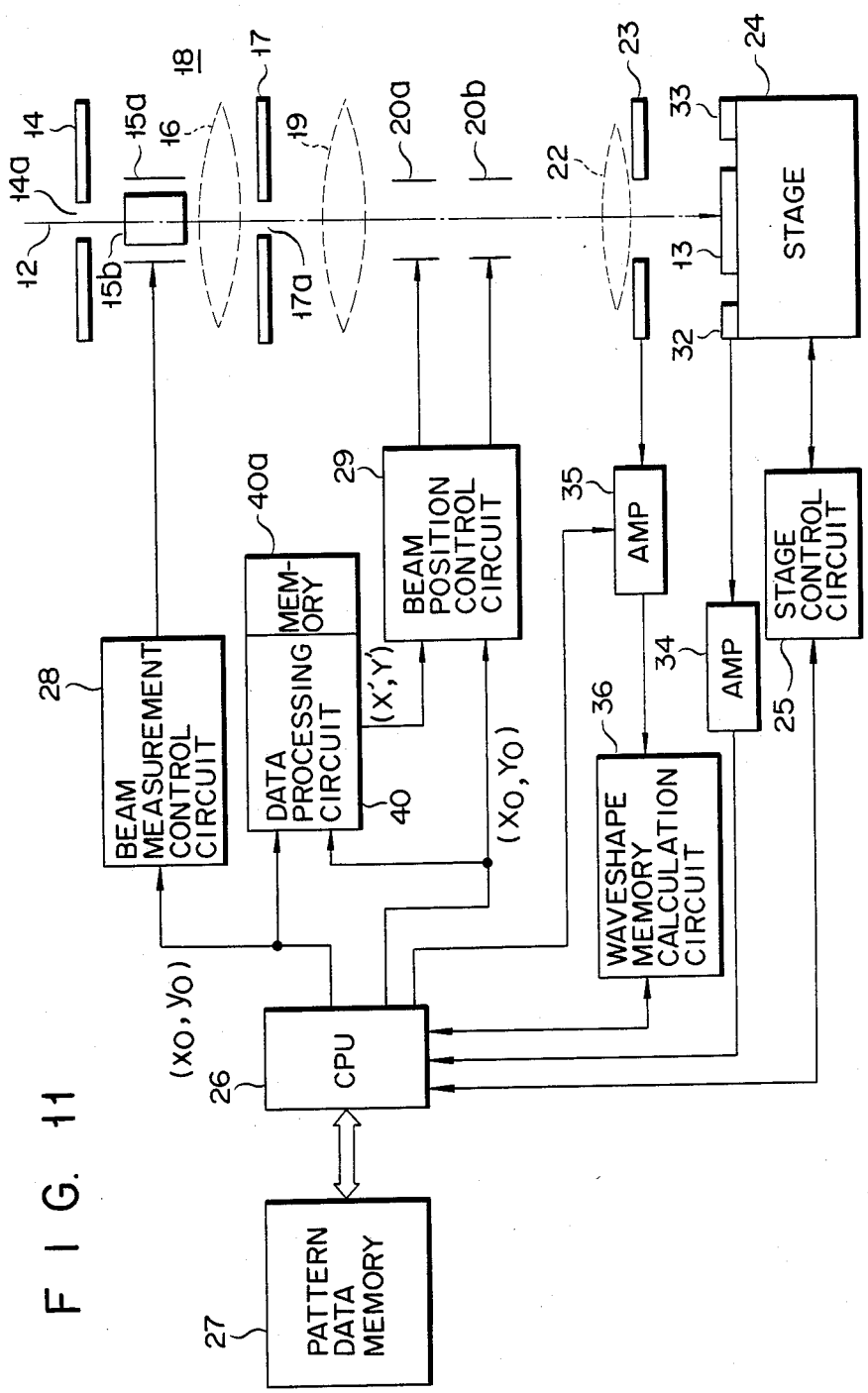
F I G. 11

CHARGED PARTICLE BEAM EXPOSURE APPARATUS

This application is a continuation of application Ser. No. 535,260, filed Sept. 23, 1983, now abandoned.

BACKGROUND OF THE INVENTION

The present invention relates to a charged particle beam exposure apparatus capable of performing exposure while changing the dimensions of the cross section of a charged particle beam in accordance with an exposure pattern.

Various types of electron beam exposure apparatus are used for forming fine exposure patterns on a semiconductor wafer or mask. The cross-sectional area of an electron beam used in such an apparatus is extremely small and is suitable for forming a fine exposure pattern. However, at the same time, this means that the exposure area per time unit is small, resulting in a very low efficiency in the manufacture of semiconductor devices.

In view of this problem, an exposure apparatus has been proposed wherein two aperture masks respectively having a rectangular aperture are sequentially arranged in the path of the electron beam. The electron beam, after passing the first aperture mask, is deflected in x and y directions by a beam deflector interposed between the two aperture masks. Thus, portions of the electron beam are cut by the edges of the second aperture mask defining its aperture. In this manner, this apparatus allows varying of the cross-sectional area or beam spot dimensions of the electron beam bombarded against an object to be exposed. In this case, of the four sides of a rectangular beam pattern radiated onto a semiconductor wafer, one pair of adjacent sides are defined by the edges of the second aperture and do not therefore change in position after beam deflection. On the other hand, the remaining two adjacent sides change in length upon beam deflection, thereby changing the dimensions of the cross section of the beam in the x and y directions. Accordingly, when a beam dimension is to be changed, it is convenient to set an intersection of two sides which do not move upon beam deflection as a reference coordinate point, and to set the beam dimensions in the x and y directions with reference to this reference coordinate point. Then, a pattern of a wide area may be exposed at high speed with a beam of increased dimensions. An apparatus of this type has a wide range of applications since it allows easy reduction in the beam dimensions as needed.

However, according to experiments conducted by the present inventors, an apparatus of the type described above which is capable of varying the beam dimensions is subject to the following problems.

Problem (1)

When the dimensions of an electron beam cross section are changed in the x and y directions, the position of the electron beam, that is, the reference coordinate point which is an intersection of the two adjacent sides of the exposure pattern corresponding to the edges of the aperture of the second aperture mask, changes.

Problem (2)

Further, the rate of the positional change of the reference coordinate point with respect to the dimensional change of electron beam cross section depends on the amount of variation $\Delta I$ of a beam current in response to a dimensional change $\Delta x$. When the amount of shift of the reference coordinate point in the x direction is $\Delta x$, and when the beam dimension in the X direction changes by $\Delta X$, the rate becomes $\Delta x/\Delta X$, for example. This will be shown in FIG. 4A.

Problem (3)

Furthermore, as the focal point of an electron lens for focusing the electron beam is shifted from the surface of an object to be exposed in the forward or backward direction, the beam position is also shifted. This will be seen in FIG. 4C later. Such shifts in beam position result in degradation in dimension and position precision of the exposure pattern.

Such shifts in beam position are considered to be attributable to a combination of an astigmatism of an objective lens, Coulomb repulsion between electrons in an electron beam passing through each lens, focal point preset error of each lens and so on. Although elimination of these factors theoretically results in the elimination of shifts in beam position, factors determining the astigmatism may be present at various positions on the beam path due to the complex structure of an electron beam exposure apparatus capable of changing beam dimensions. An apparatus free from factors causing astigmatism is very costly.

Defocusing caused by Coulomb repulsion can be corrected by a correction lens. However, the lens must be driven at a high speed in accordance with the dimensions of the beam spot. This also results in a complex manufacturing process and an expensive apparatus.

SUMMARY OF THE INVENTION

It is an object of the present invention to provide a charged particle beam exposure apparatus which is capable of automatically correcting a shift in beam position, which is usually caused by a change in a beam dimension, and improving the dimension precision of an exposure pattern, and which meets the requirement of low manufacturing cost.

In order to achieve the above object, there is provided, according to the present invention, a charged particle beam exposure apparatus having a charged particle beam source, first and second aperture masks which respectively have a rectangular aperture and are sequentially arranged on a charged particle beam path extending from the charged particle beam source to an object to be exposed, means for supplying pattern data and beam dimension and beam position signals corresponding thereto, beam deflecting means arranged between said first and second aperture masks for controlling beam dimensions, and means for scanning the charged particle beam having controlled dimensions on the object to be exposed and for drawing a predetermined pattern, characterized in that the apparatus further comprises means for generating beam position correction signals in accordance with the dimensions of the charged particle beam set by said beam deflecting means, and means for correcting a beam position on the object to be exposed in accordance with the beam position correction signals.

According to the present invention, shifts in beam position due to changes in the dimensions of a cross section of the charged particle beam can be reliably corrected, so that high-precision exposure may be performed. The beam position correcting means and the means for supplying a beam position correction signal corresponding to the beam dimension can be of simple configuration. Thus, the manufacturing cost is not increased, and an inexpensive charged particle beam exposure apparatus is provided.

BRIEF DESCRIPTION OF THE DRAWINGS

FIG. 2 is a representation for explaining a method for measuring the beam dimensions;

FIG. 3 is a block diagram showing an example of a correction signal generating circuit;

FIGS. 10 and 11 are block diagrams schematically showing the configurations of other embodiments of the present invention.

DETAILED DESCRIPTION OF THE PREFERRED EMBODIMENTS

The preferred embodiment of the present invention will now be described with reference to the accompanying drawings. In a description to follow, an electron beam position indicates an intersection coordinate point (XR, YR) of two adjacent sides of an electron beam 12 corresponding to the edges of a rectangular aperture 17a of a second aperture mask 17, and an electron beam dimension includes longitudinal and transverse dimensions of the beam in the x and y directions with reference to the coordinate point (XR, YR).

Figure 1:
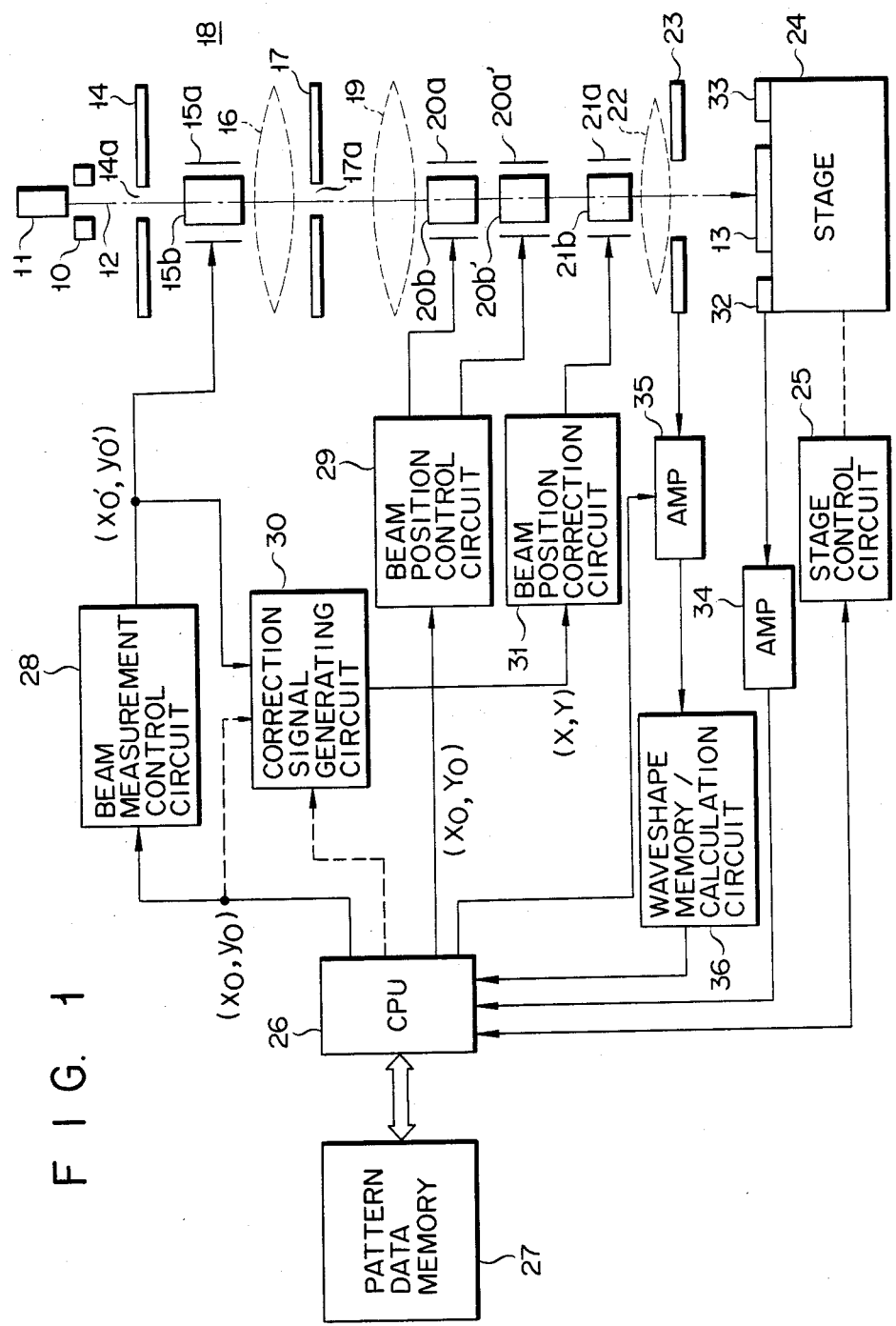
FIG. 1 is a schematic block diagram of a charged particle beam exposure apparatus according to an embodiment of the present invention.

In the embodiment shown in FIG. 1, the electron beam 12 from an electron beam source 11 irradiates a semiconductor wafer 13 as an object to be exposed, through its beam path. A beam dimension changing mechanism 18 is on this beam path. The beam dimension changing mechanism 18 has the following parts arranged from the beam source 11 to the wafer 13 in the order named: blanking plates 10, a first aperture mask 14 having a rectangular aperture 14a, a pair of x deflectors 15a for controlling beam dimensions, a pair of y deflectors 15b, a first electron lens 16, and the second aperture 17 having the rectangular aperture 17a.

A second electron lens 19, two pairs of x scanning plates 20a, 20a', two pairs of y scanning plates 20b, 20b', a pair of x correction deflectors 21a, a pair of y correction deflectors 21b, an objective electron lens 22, and a reflected electron sensor 23 are arranged next to the beam dimension changing mechanism 18 on the beam path of the electron beam 12.

The semiconductor wafer 13 as an object to be exposed is placed on a flat surface of a stage 24. The stage 24 is driven in the x and y directions and the directional position is detected by a stage control circuit 25. A position detection signal from the stage control circuit 25 is supplied to a CPU 26. In response to the position detection signal, the CPU 26 supplies a stage drive signal to the stage control circuit 25, and a control signal to a beam position control circuit 29.

An exposure pattern to be drawn on the semiconductor wafer 13 by the electron beam 12 is determined by pattern data stored in a pattern data memory 27 coupled to the CPU 26. The pattern data in the pattern data memory 27 is accessed by the CPU 26 and readout pattern data is fetched therein. The CPU 26 supplies beam dimension data (x0, y0) included in the readout pattern data to a beam measurement control circuit 28. The beam measurement control circuit 28 decodes the input beam dimension data (x0, y0) and produces proper voltage signals (x0', y0') as beam dimension signals for obtaining predetermined beam dimensions. The voltage signals are supplied to the x and y deflectors 15a and 15b so as to deflect the electron beam 12 in the x and y directions accordingly. Pattern data (X0, Y0) for exposing the semiconductor wafer 13 in a predetermined pattern is decoded by the beam position control circuit 29 which produces two voltage signals for defining the x and y beam positions corresponding to the input pattern. The x voltage signal from the circuit 29 is supplied to the two pairs of x scanning plates 20a, 20b, and the y voltage signal is supplied to the two pairs of y scanning plates 20b, 20b'.

The voltage signals (x0', y0') for obtaining the predetermined beam dimensions from the beam measurement control circuit 28 are supplied to a correction signal generating circuit 30 for generating signals for beam position correction. The correction signal generating circuit 30 generates correction signals (X, Y) for beam position correction in the x and y directions and supplies them to a beam position correction circuit 31. The correction signal generating circuit 30 will be described in detail later. The beam position correction circuit 31 produces voltage signals for correcting the beam position in the x and y directions, and supplies them to the x and y correction deflectors 21a and 21b, respectively.

The position and dimensions of the electron beam 12 on the wafer 13 can be detected by a known method as follows. A Faraday cage 32 and a beam shape sensor 33 are arranged next to the wafer 13 on the surface of the stage 24 shown in FIG. 1. An output signal from the Faraday cage 32 is supplied to the CPU 26 through an amplifier 34. The beam shape sensor 33 comprises, as shown in FIG. 2, a base 33a of a material having a small coefficient of electron reflection such as beryllium, and a fine particle 33b of a material having a high coefficient of electron reflection such as gold attached on the flat surface of the base 33a. The reflected electron sensor 23 is arranged above the fine particle 33b with its sensor surface facing the particle 33b. The surface of the beam shape sensor 33 is level with that of the wafer 13. The fine particle 33b has a small diameter of 0.1 $\mu$m to 0.3 $\mu$m.

An output signal from the reflected electron sensor 23 is amplified by an amplifier 35 and is supplied to a waveshape memory/calculation circuit 36. The waveshape memory/calculation circuit 36 includes a RAM, for example, for storing a reflected electron intensity distribution which corresponds to a position and dimensions of the electron beam 12 and which is obtained from the output from the amplifier 35. The obtained data in the waveshape memory/calculation circuit 36 is read out upon being accessed by the CPU 26 and is supplied to the CPU 26.

Figure 4A:
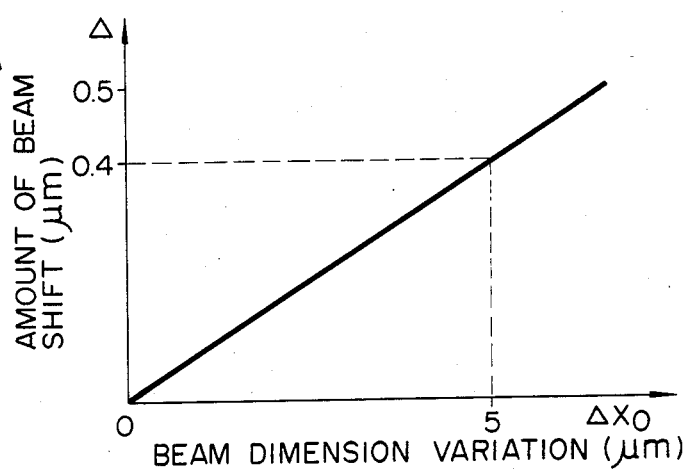
FIGS. 4A, 4B and 4C are graphs showing the relationship between the amount of or rate of shift in beam position and the beam dimension variation, beam current variation, and defocusing amount, respectively.

As shown in FIG. 3, the correction signal generating circuit 30 comprises, for example, simple potentiometers (voltage dividers) 30-1 and 30-2. The output signals (x0', y0') from the beam measurement control circuit 28 are supplied to one fixed end of the potentiometers 30-1 and 30-2, which supply divided voltages as correction signals (X, Y) to the beam position correction circuit 31. The voltage dividing ratios of the potentiometers 30-1 and 30-2 are set to equal the ratios of the beam dimensions to the amounts of shift in the beam position in corresponding directions. A preset voltage dividing ratio corresponding to the ratio K of the beam dimension to the amount of shift in beam position (or proportionality constant K) can be experimentally determined by measuring the amount of shift for various values of each beam dimension. FIG. 4A shows an example of the experiment results. In this example, the amount of the beam dimension variation in the x direction changes linearly with respect to the amount of shift in beam position in this direction. Thus, the ratio of the amount of the beam dimension variation to the amount of shift in beam position is constant irrespective of changes in the beam dimension. If the ratio of the amount of a beam dimension variation in one direction to the amount of shift in beam position in this direction changes exponentially, a corresponding ratio K can be set.

Figure 5:
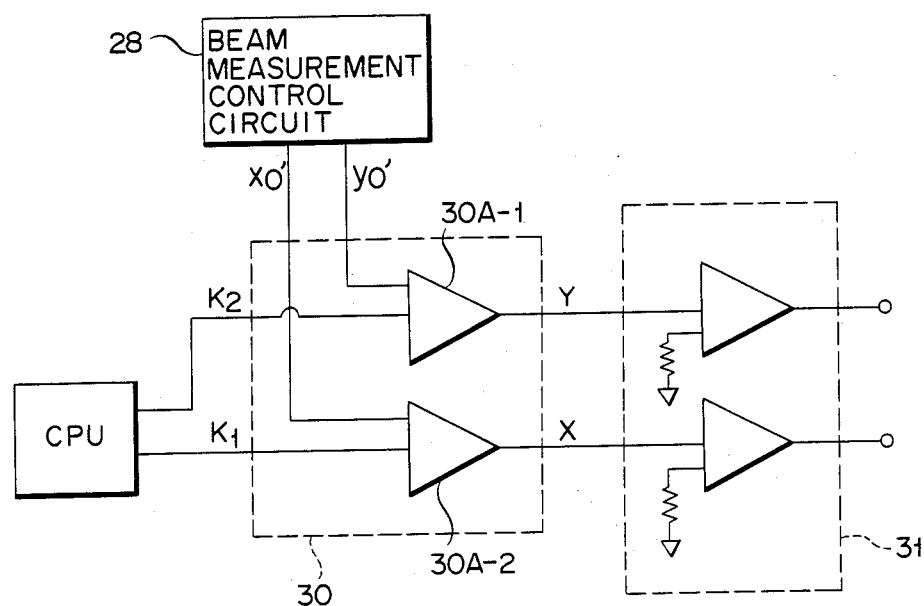
FIG. 5 is a block diagram showing another example of a correction signal generating circuit.

The correction signal generating circuit 30 may comprise multipliers 30A-1 and 30A-2 as shown in FIG. 5. In this case, proportionality constants K1 and K2 which are experimentally determined for the beam dimension signals (x0′, y0′) are produced from the CPU 26. Multiplication of the constants K1, K2 by the signals (x0′, y0′) provides correction signals X and Y.

Figure 6:
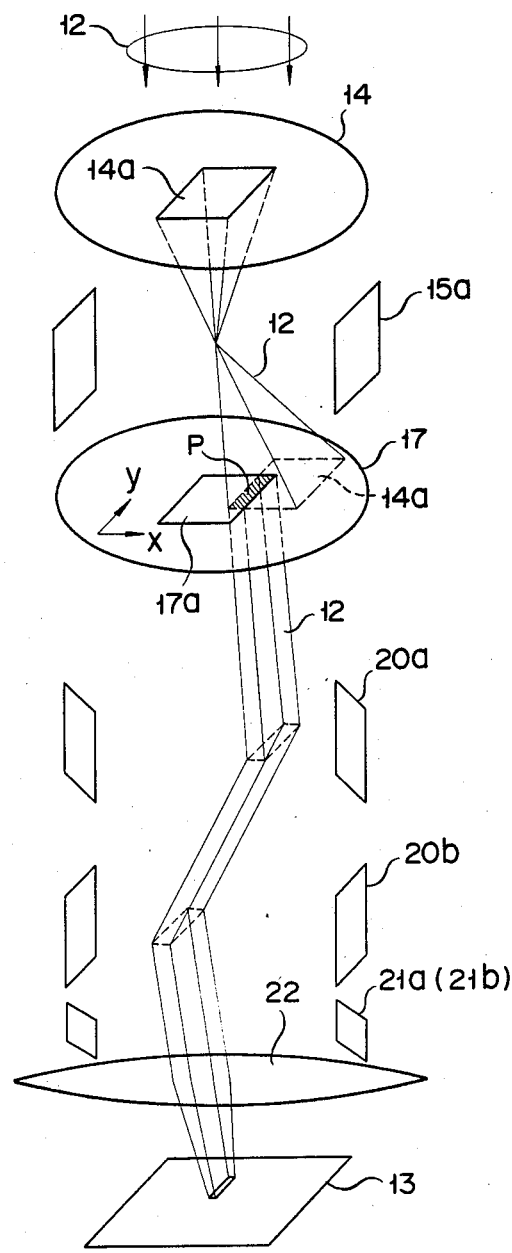
FIG. 6 is a schematic perspective view showing a beam shape along the path of the beam in the embodiment shown in FIG. 1.
Figure 7:
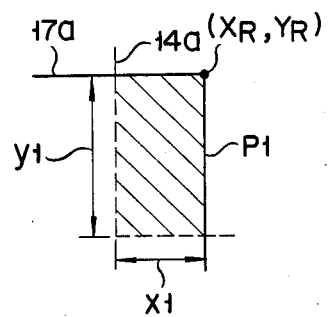
FIGS. 7, 8A and 8B are views for explaining the mode of operation of the embodiment shown in FIG. 1.
Figure 8A:
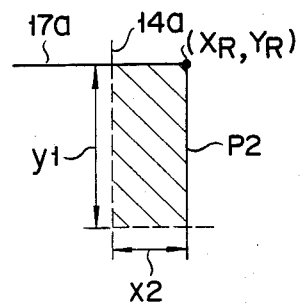

The mode of operation of the embodiment shown in FIGS. 1 to 5 will now be described, also with reference to FIGS. 6 to 8. FIG. 6 schematically shows changes in the shape of a cross section of the electron beam 12 while it is travelling toward the wafer 13 from the source 11 of the embodiment shown in FIG. 1. Note that only the main components are shown in the figure. Referring to FIG. 6, the electron beam 12 irradiated from the electron gun (beam source) 11 as the electron beam source has a diameter which is at least sufficiently larger than the maximum dimension of the rectangular aperture 14a of the first aperture mask 14. Thus, the electron beam 12 emerging from the aperture 14a has a cross section having the same shape as that of the aperture 14a, and the density of the beam current in the aperture 14a is constant. The electron beam 12 is then focused by the first electron lens 16 (FIG. 1) and is deflected through predetermined angles in the x and y directions by the deflectors 15a and 15b (only the deflector 15a being shown here). As a result, the electron beam 12 is deflected to a position indicated by the broken line on the second aperture mask 17. The electron beam 12 emerging from the aperture 17a of the second aperture 17 has a cross sectional area P (hatched portion) corresponding to an overlapping portion of the image of the aperture 14a indicated by the broken line and the aperture 17a. The electron beam 12 with changed dimensions is deflected again in the x and y directions by the x and y scanning plates 20a, 20a′, 20b and 20b′, is position-corrected by the deflectors 21a and 21b, and is irradiated onto the wafer 13 through the second objective electron lens 22.

Figure 8B:
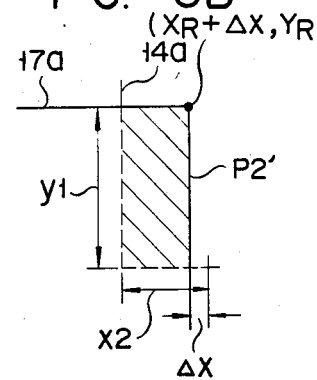

When the beam dimension in the x direction is set to be 5 μm as shown in FIG. 4A, the reference coordinate point (XR′, YR′) shifts in the x direction by about 0.4 μm from a point at which the beam dimension is set to be 0 μm, resulting in a beam shift of about 0.4 μm. Assume that the dimensions of an electron beam having an area P1 (x1×y1) as shown in FIG. 7 are changed to have an area P2 (x2×y1). In this case, reference coordinate point (XR′, YR′) should have a value (XR, YR) theoretically. However, since, in practice, the beam shifts in accordance with the change in beam dimensions, the position (XR′, YR′) of the electron beam 12 moves to a position (XR+Δx, YR), as shown in FIG. 8B. Where, XR′ is larger than XR. If the x-coordinate x2 is 5 μm, the corresponding amount of beam shift Δx is 0.4 μm as seen in FIGS. 4A and 8B. Thus, the beam position must be corrected in the x-axis direction such that the amount of beam shift Δx remains zero irrespective of changes in the beam dimension. This is also applicable to a case wherein the reference point shift is in the y direction. More specifically, if the beam dimension and the amount of shift in beam position in this direction are measured in advance, the correction signals for obtaining a zero amount of shift in beam position in accordance with different values of the beam dimension can be easily obtained using the circuit as shown in FIG. 3 or 5. In the example shown in FIG. 3, the sliding contacts of the potentiometers 30-1 and 30-2 are set in accordance with the slope of the line in FIG. 4A. The correction signals X and Y can be obtained in correspondence with the beam dimension signals x0′ and y0′.

In the example shown in FIG. 5, the proportionality constants K1 and K2 corresponding to the beam dimensions shown in FIG. 4A are stored in advance in the ROM (not shown) in the CPU 26. Multiplication of the signals x0′ and y0′ by the proportionality constants K1 and K2 readily yields the correction signals X and Y.

Figure 9:
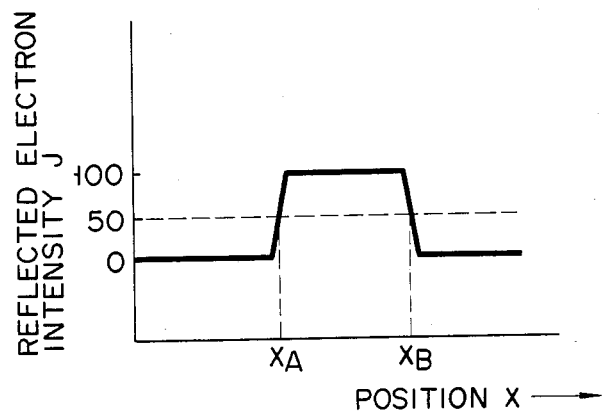
FIG. 9 is a graph for explaining a method for measuring the beam dimension.

When pattern exposure is performed by the electron beam 12, data representing the position and dimensions of the beam 12 on the wafer 13 is supplied to the CPU 26 to determine the relationship between the beam dimensions and the amounts of shift in beam position. For this purpose, prior to actual pattern exposure, the beam shape sensor 33 as shown in FIG. 2 is scanned with the electron beam 12. When the fine gold particle 33b is scanned with the electron beam 12, a large number of electrons are reflected from the particle 33b. Then, as shown in FIG. 9, the reflected electron intensity output J from the sensor 23 becomes significantly high between positions xA and xB along the x in accordance with a beam dimension $\overline{AB}$ along the x direction. Accordingly, the dimension of the cross section of the electron beam 12 along the x direction can be detected by detecting the output J at a threshold value "50", for example, using the output from the sensor 23, storing this output value in the waveshape memory/calculation circuit 36, reading it out under access control of the CPU 26, and calculating (xB−xA) in association with the scanning rate of the electron beam 12. The dimension of the cross section of the electron beam 12 along the y direction can be similarly measured by longitudinally scanning the fine particle 33b.

The position of the electron beam 12 can be determined by determining the coordinate point (XR, YR) as shown in FIG. 2. The coordinate point (XR, YR) is on a line which includes point B. This means the coordinate XR is the position of a reflected electron intensity distribution xB shown in FIG. 9 and stored in the waveshape memory/calculation circuit 36. It is to be noted that the position of the stage 24 can be correctly measured by a known distance measuring system which uses a laser beam which is irradiated from the stage control circuit 25 onto the stage 24 and reflected back to the circuit 25.

With the apparatus of the configuration as described above, the beam position, which changes in accordance with changes in the beam dimensions, can be corrected. Such correction can be realized by adding the deflectors 21a and 21b, the correction signal generating circuit 30 and the beam position correction circuit 31 to a general electron beam exposure apparatus. For this reason, an exposure apparatus of the present invention is simple in construction and is inexpensive to manufacture. In the embodiment described above, the shift in the beam position is only corrected corresponding to changes in the beam dimensions. Such a shift in the beam position is known to be largely dependent on changes in the beam dimensions. This means that the shift in beam position can be substantially corrected by the apparatus of the embodiment described above, resulting in an extremely high pattern precision.

Figure 10:
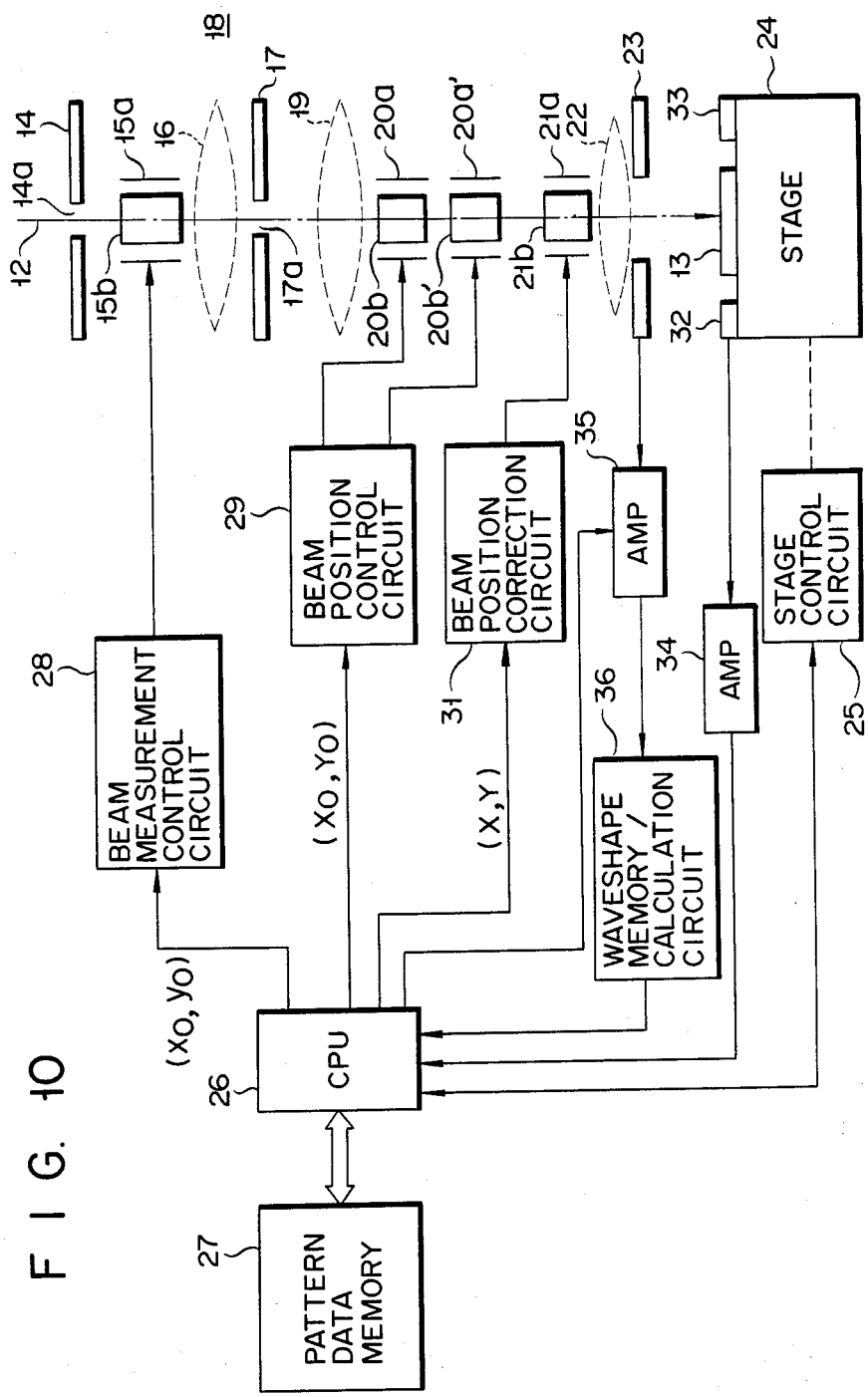

FIG. 10 is a schematic block diagram of a second embodiment of the present invention. The same reference numerals as used in FIG. 1 denote the same parts in FIG. 10. The embodiment shown in FIG. 10 differs from that shown in FIG. 1 in that the correction signal generating circuit 30 in FIG. 1 is eliminated and instead the CPU 26 has a function of obtaining the correction signals X and Y. The CPU 26 has therein a RAM which stores the ratio of the shift in beam position to the beam dimensions, such a ratio for the embodiment shown in FIG. 1 being shown in FIG. 4A. Pattern data fetched in the CPU 26 from the pattern data memory 27 includes data (x0, y0) representing the beam dimensions. The CPU 26 multiplies the data (x0, y0) by the ratio read out from the RAM so as to obtain the correction signals X and Y. The correction signals X and Y thus obtained are supplied to the beam position correction circuit 31.

Figure 4B:
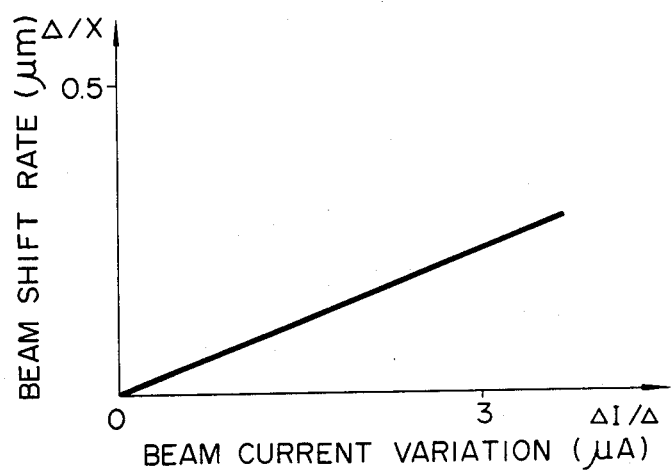
Figure 4C:
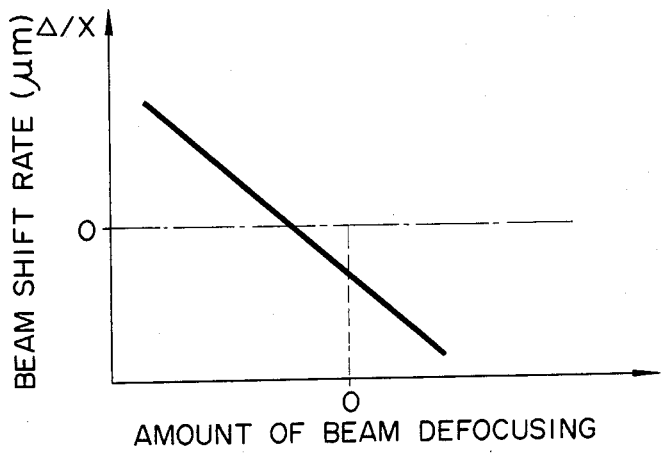

As shown in FIGS. 4B and 4C, if the beam current variation rate or the defocusing amount of the electron lens changes, the rate of the beam position shift also changes. In order to compensate for this, the ratio of the beam current variation rate to the rate of the beam shift in beam position, and the ratio of the amount of defocusing to the ratio of shift in beam position are measured in advance. The measurement data is stored in the RAM of the CPU 26. With a change in the beam current or the defocusing amount of the electron lens, the correction signals for correction against a change in the beam dimensions are further corrected, thus achieving pattern exposure with higher precision.

In the embodiment described above, the ratio of the beam dimensions to the amount of shift in beam position is stored in the RAM of the CPU 26. However, data representing the amount of shift in beam position corresponding to each beam dimension can be stored in the RAM in the form of a memory table. Then, the RAM can be accessed using the beam dimension signal as an address signal from the CPU 26. The readout data representing the corresponding amount of shift is in the beam position used for obtaining correction signals. In order to minimize error in the correction signals, optimization of correction signals can be performed.

The above-mentioned correction methods are all applicable in a case wherein the shift of the reference position with respect to the variation in beam dimension can be assumed to vary linearly. However, in the case of a beam exposure apparatus for exposing a pattern of a VLSI having pattern dimensions of less than 1 μm, the above noted linear approximation can not be applied, because the precision of the pattern can not be maintained. The precision of the pattern depends upon the apparatus construction, degree of control precision of an electron optics system, nature of a material forming the exposure system, and mechanical precision. The following third embodiment will be suited for the above-mentioned case.

The third embodiment of the present invention is similar to the first embodiment shown in FIG. 1. Accordingly, a detailed description thereof will be omitted, and reference to FIG. 1 will be made for descriptive purposes. In the third embodiment, the beam position correction signals X and Y are represented as nth-order functions of the beam dimension data (x0, y0). For example, X and Y including the terms up to the second order (n=2) of the beam dimension data (x0, y0) are given by:

$$X = k1x0 + k2y0 + k3x0y0 + k4x0^2 + k5y0^2$$

$$Y = k6x0 + k7y0 + k8x0y0 + k9x0^2 + k10y0^2 \quad (1)$$

where X is the amount of shift in beam position in the x direction, Y is the amount of shift in beam position in the y direction, x0 is the beam dimension in the x direction, y0 is the beam dimension in the y direction, and k1 to k10 are constants which can be experimentally determined and which depend on at least on the beam current density, maximum beam dimensions, focal point of the electron lens, and so on. The constants k1 to k10 are stored in the CPU 26. The correction signal generating circuit 30 incorporates therein a calculation circuit. The calculation circuit receives the beam dimension data (x0, y0) from the CPU 26 or the beam dimension signals (x0′, y0′) from the beam dimension control circuit 28, as indicated by the broken line in FIG. 1. The calculation circuit similarly receives the constants k1 to k10 from the CPU 26 so as to perform equation (1) calculations. In the third embodiment as described above, beam position correction can be performed with higher precision than in the embodiments shown in FIGS. 1 and 10.

FIG. 11 is a schematic block diagram of a fourth embodiment of the present invention. The fourth embodiment differs from the first embodiment of FIG. 1 in that the correction deflectors 21a and 21b and the beam position correction circuit 31 are eliminated and a data processing circuit 40 with a memory 40a is used in place of the correction signal generating circuit 30. The data processing circuit 40 includes a CPU which receives the beam dimension data (x0, y0) from the CPU 26 and obtains the correction signals X and Y in accordance with equation (1). The data processing circuit 40 produces correction signals X, Y and produces corrected beam position signals X′ and Y′ in accordance with the correction signals X and Y thus obtained and the beam position signals X0 and Y0 from the CPU 26.

The beam position control circuit 29 receives the corrected beam position signals X′ and Y′ and produces the beam position setting voltages in both the x and y directions which have been corrected for the shift in beam position corresponding to a change in the beam dimensions. The voltages from the beam position control circuit 29 are applied to the deflecting or scanning plates 20a and 20b. With the configuration of the fourth embodiment of the present invention, the electron beam path of the electron beam 12 in the apparatus is similar to that of a conventional electron beam exposure apparatus. Accordingly, the present invention can be readily applied to an exposure apparatus of conventional configuration.

The present invention is not limited to the particular embodiments described above. Various changes and modifications may be made within the spirit and scope of the present invention. For example, the configurations of the correction signal generating circuit 30, the beam position correction circuit 31, the correction deflectors 21a and 21b, and so on are not limited to those of the embodiments described above. The apparatus of the present invention must essentially have a means for obtaining the amount of shift in beam position corresponding to a change in the dimension of an electron beam, and a means for correcting the beam position in accordance with the obtained amount of shift in beam position. Instead of using an electron beam, another charged particle beam such as an ion beam may be used in place of the electron beam in the present invention.

What is claimed is:

1. A charged particle beam exposure apparatus comprising:
   a charged particle beam source for generating a charged particle beam;
   first and second aperture masks which respectively have a rectangular aperture and are sequentially arranged on a charged particle beam path extending from the charged particle beam source to an object to be exposed;
   means for supplying pattern data and beam dimension and beam position signals corresponding thereto;
   beam deflecting means arranged between said first and second aperture masks for controlling a beam dimension in accordance with the beam dimension signals; and
   means for scanning the charged particle beam having controlled beam dimensions on the object to be exposed and for drawing a predetermined pattern, wherein the apparatus further comprises
   means for generating beam position correction signals in accordance with the beam dimensions of the charged particle beam set by said beam deflecting means, and
   means for correcting a beam position on the object to be exposed in accordance with the beam position correction signals.

2. An apparatus according to claim 1, wherein said beam position correction signal generating means includes a correction signal generating circuit which receives the beam dimension signals and produces the beam position correction signals; and said beam position correcting means includes a beam position correction circuit for generating a voltage signal in accordance with said correction signals, and deflection plates for deflecting said charged particle beam in accordance with said voltage signals.

3. An apparatus according to claim 2, wherein said correction signal generating circuit includes potentiometers which produce divided voltage outputs corresponding to the beam dimension signals as the beam position correction signals.

4. An apparatus according to claim 3, wherein a voltage dividing ratio of each of said potentiometers is set to equal a ratio of the beam dimension corresponding thereto to an amount of shift in the beam position.

5. An apparatus according to claim 2, wherein said beam position correction signal generating means has multipliers each of which receives the beam dimension signals at one input terminal thereof, and means for supplying predetermined proportionality constant data to the other input terminal of each of said multipliers, the beam position correction signals being obtained from said multipliers.

6. An apparatus according to claim 2, wherein said beam position correction signal generating circuit has a data processing circuit which obtains beam position correction signals X and Y in accordance with equations:

$$X = k1x0 + k2y0 + k3x0y0 + k4x0^2 + k5y0^2$$

$$Y = k6x0 + k7y0 + k8x0y0 + k9x0^2 + k10y0^2$$

where X is the amount of shift in a beam position in an x direction, Y is the amount of shift in the beam position in a y direction, x0 and y0 are dimensions of the beam in the x and y directions, and k1 to k10 are constants determined by at least three factors a beam current density, maximum beam dimensions, and a lens focal point.

7. An apparatus according to claim 1, wherein said beam position correction signal generating means includes a central processing unit, said CPU incorporates therein a memory which stores data representing a ratio of the amount of shift in beam position to the beam dimensions, and has a function to multiply the beam dimension signals by data representing the ratio to obtain the beam position correction signals.

8. An apparatus according to claim 1, wherein said beam position correction signal generating means includes means for measuring beam dimensions and beam positions of said charged particle beam; and data processing means for obtaining a ratio of said measured beam dimensions and beam positions.

* * * * *